(12) United States Patent
Fink et al.

(10) Patent No.: US 7,005,842 B2
(45) Date of Patent: Feb. 28, 2006

(54) PROBE CARTRIDGE ASSEMBLY AND MULTI-PROBE ASSEMBLY

(75) Inventors: Steven T. Fink, Mesa, AZ (US); Thomas H. Windhorn, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 134 days.

(21) Appl. No.: 10/451,214

(22) PCT Filed: Dec. 20, 2001

(86) PCT No.: PCT/US01/45865

§ 371 (c)(1), (2), (4) Date: Feb. 6, 2004

(87) PCT Pub. No.: WO02/052285

PCT Pub. Date: Jul. 4, 2002

(65) Prior Publication Data

US 2004/0113603 A1  Jun. 17, 2004

Related U.S. Application Data

(60) Provisional application No. 60/257,237, filed on Dec. 22, 2000.

(51) Int. Cl.
*G01R 31/02* (2006.01)
(52) U.S. Cl. ............... 324/72.5; 324/715; 324/754; 324/757
(58) Field of Classification Search ............... 324/72.5, 324/715, 754, 757
See application file for complete search history.

(56) References Cited

U.S. PATENT DOCUMENTS

| | | | | |
|---|---|---|---|---|
| 4,491,788 A | * | 1/1985 | Zandonatti | ............... 324/72.5 |
| 5,339,039 A | | 8/1994 | Carlile et al. | ............... 324/655 |
| 5,686,832 A | | 11/1997 | Ayres et al. | ............... 324/146 |
| 5,723,979 A | | 3/1998 | Mohr | ............... 324/642 |
| 5,942,701 A | * | 8/1999 | Kamiya | ............... 73/866.5 |
| 5,982,187 A | | 11/1999 | Tarzwell | ............... 324/756 |

* cited by examiner

*Primary Examiner*—Anjan Deb
*Assistant Examiner*—John Teresinski
(74) *Attorney, Agent, or Firm*—Oblon, Spivak, McClelland, Maier & Neustadt, P.C.

(57) ABSTRACT

A probe cartridge assembly and a multi-probe assembly (10) including a mounting plate having a plurality of the probe cartridge assemblies mounted on the mounting plate. The probe cartridge assembly generally includes a mounting member, a probe insulator (30), a probe (40), a ferrule (50), a lead insulator (60), a retaining member (70), and a wire having an electrical lead. The electrical lead is positioned within a cavity in the ferrule, and an inclined surface of the ferrule is contacted to an inclined surface of the probe within an area defined by the probe insulator and the lead insulator. The probe insulator and the lead insulator are held within an area defined by the mounting member and the retaining member. The retaining member and the mounting member are adjustably mated to each other in order to provide a clamping force to ensure proper electrical interconnection between the electric lead, the ferrule, and the probe.

19 Claims, 3 Drawing Sheets

PROBE CARTRIDGE ASSEMBLY AND MULTI-PROBE ASSEMBLY

CROSS-REFERENCE TO RELATED APPLICATIONS

This application is a National Stage of International Application No. PCT/US01/45865 filed Dec. 20, 2001, which claims the benefit of U.S. Provisional Application No. 60/257,237 filed Dec. 22, 2000.

BACKGROUND OF THE INVENTION

1. Field of the Invention

The present invention relates generally to a probe cartridge assembly including a probe for analyzing an environment, and a multi-probe assembly including at least one such probe cartridge assembly.

2. Discussion of the Background

Electric probes are measurement tools used in the characterization of low temperature plasmas like those used in the semiconductor manufacturing industry. Electric probes have been utilized in a variety of configurations and geometric shapes. Each configuration and geometry has advantages and disadvantages compared to the others. One such configuration is the single, cylindrical probe, called a Single Langmuir Probe.

An example of such a single probe is constructed of tungsten wire housed in a quartz tube. The quartz tube is 0.25 inches in outer diameter. The 0.030-inch diameter tungsten wire extends approximately 0.076 inches beyond the end of the quartz tube, forming a probe tip with a surface area of 0.05 $cm^2$ exposed to the plasma. The probe is inserted into the plasma through a vacuum bellows, which allows linear translation of the probe tip through the plasma in one direction only. The probe tip is maintained at 5 mm above the surface of the chuck. The procedure used by the inventors has been to record the probe current-voltage characteristics at the center of the chuck, and at one-inch intervals from the center to the edge, e.g., 0, 1, 2, 3 and 4 inches from the center for an 8-inch wafer.

The inventors have determined that because the single probe arrangement is mounted in a fixed azmithal position in a feedthrough on the side of the chamber, measurements along different (azmithal) axes require the physical repositioning (rotation) of the source. Before a new set of measurements can be made numerous mechanical operations must be performed, including removing all fluid and electrical connections, and venting the system to atmosphere. It has been the inventors' experience that these mechanical operations consume several hours for each new axis of rotation. A set of probe measurements from center to edge in four directions (+x to −x, and +y to −y) can take more than a full day using a single probe. In addition, each time the source is vented and physically repositioned there is a potential to introduce measurement inconsistencies due to small variations in the physical repositioning of the source, and the vertical position of the probe with respect to the chuck and the bottom of the source.

In an effort to eliminate these potential sources of error and to reduce the total measurement time, the inventors have constructed a multi-probe assembly including a probe cartridge assembly as described below.

SUMMARY OF THE INVENTION

Accordingly, the present invention advantageously provides a multi-probe assembly configured to house a plurality of probe cartridge assemblies. The multi-probe assembly generally includes a mounting plate having a plurality of mounting holes and a plurality of probe cartridge assemblies each mounted in a corresponding one of the plurality of mounting holes.

The present invention further advantageously provides probe cartridge assemblies that generally include a mounting member, a probe insulator, a probe, a ferrule, a lead insulator, a retaining member, and a wire having an electrical lead. The probe cartridge assemblies can be individually removed from the multi-probe assembly for repair or replacement.

The probe cartridge assembly of the present invention includes a mounting member that has an external surface with external threads that are configured to mate with internal threads in the mounting hole. The mounting member also includes an internal cavity, and an aperture or opening extending from a front surface of the mounting member to the internal cavity. The internal cavity of the mounting member preferably has internal threads. The mounting member preferably includes a tool engagement portion on an outer surface thereof, which can be utilized to insert and remove the mounting member from the mounting hole.

The probe insulator of the present invention includes a first portion that is positioned within the internal cavity of the mounting member. The probe insulator includes a second portion that is configured to extend through the opening in the mounting member and the opening in the mounting plate, when the mounting plate, the mounting member, and the probe insulator are assembled. The probe insulator has an internal cavity, and an opening extending through the probe insulator from a front end of the probe insulator to the internal cavity thereof.

The probe of the present invention includes a first portion that is configured to fit within the internal cavity of the probe insulator. The probe further includes a second portion that is also preferably cylindrical in shape and is configured to extend through the opening in the probe insulator, when the probe and the probe insulator are assembled. The second portion has a probe tip on a terminal end thereof. The probe includes an internal cavity that includes an inclined surface. When assembled, the probe is positioned such that the first portion is within the internal cavity of the probe insulator and the tip extends through the opening of the probe insulator. The probe is made of an electrically conductive material.

The ferrule of the present invention has an outer inclined surface that is configured to abut the inclined surface of the internal cavity of the probe when assembled. The ferrule is made of a deformable and conductive material. The ferrule further includes an internal cavity. When the probe assembly is assembled, the electrical lead preferably extends through or within the ferrule via the internal cavity thereof.

The lead insulator of the present invention includes a portion that is configured to fit within the internal cavity of the probe insulator. The lead insulator has a through-hole that extends from a front surface thereof to a rear surface thereof. When the probe assembly is assembled, the lead insulator is positioned such that a portion of the lead insulator is within the internal cavity of the probe insulator and abuts the rear surface of the ferrule.

The retaining member of the present invention has an exterior surface that is configured to fit within the internal cavity of the mounting member. The exterior surface includes exterior threads on a front portion thereof, which are configured to mate with the internal threads on the internal cavity of the mounting member. The exterior surface further includes a tool engagement portion. The retaining member has a through-hole that extends from a front surface of the retaining member to a rear of the retaining member. When the probe assembly is assembled, the retaining member is positioned such that the surface of the retaining member abuts an adjacent surface of the lead insulator, and such that a portion of the retaining member is within the internal cavity of the mounting member and the retaining member is adjustably mated with the mounting member.

The wire of the present invention includes an electrical lead and extends through the through-hole of the retaining member and through the through-hole of the lead insulator. The electrical lead of the wire extends within the internal cavity of the ferrule wherein the electrical lead is electrically connected to the ferrule.

The system of the present invention advantageously provides a structure where the retaining member and the mounting member are adjustably mated to each other in order to provide a clamping force to ensure proper electrical interconnection between the electric lead, the ferrule, and the probe. When the retaining member is tightened onto the mounting member using the tool engagement portion, the retaining member and the mounting member inwardly compress the probe and the ferrule between the probe insulator and the lead insulator. The compressive forces acting on the probe and the ferrule cause the inclined surface of the probe to compress the outer inclined surface of the deformable ferrule, thereby causing the ferrule to squeeze down on the electrical lead and ensure a good electrical interconnection between the probe, the ferrule, and the electrical lead. When the retaining member is torqued to a predetermined value, the ferrule is deformed to captivate the electrical lead, thereby providing excellent contact with the probe and consequently the probe tip. The probe insulator and the lead insulator are made of an electrically insulative or non-conductive material, and thereby provide an electrically insulative barrier around the probe and the ferrule.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DESCRIPTION OF THE PREFERRED EMBODIMENTS

Figure 1:
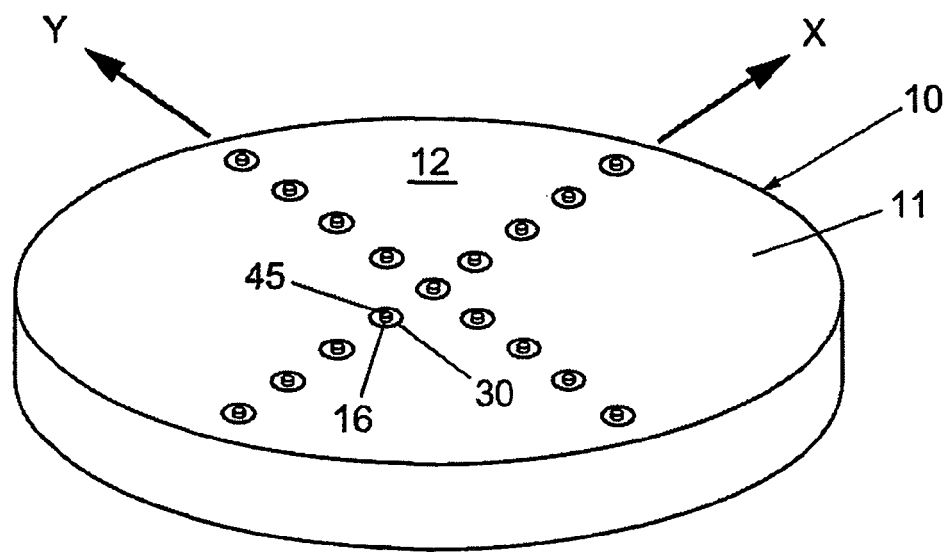
FIG. 1 is a perspective view of an embodiment of a multi-probe assembly according to the present invention.
Figure 2:
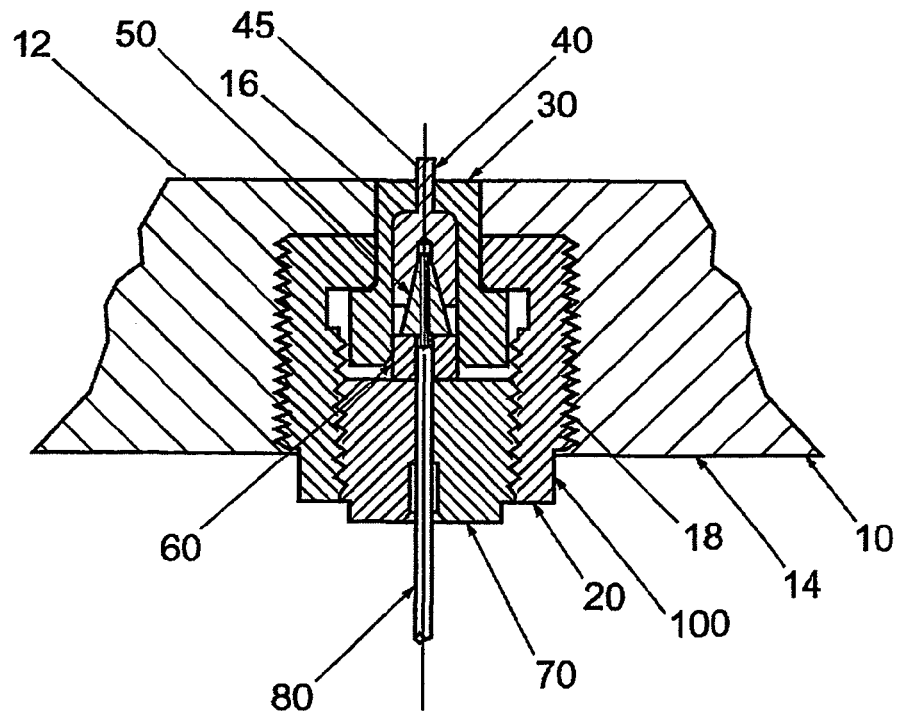
FIG. 2 is a cross-sectional, partial side view of the multi-probe assembly of FIG. 1 depicting an embodiment of a probe cartridge assembly according to the present invention.
Figure 3:
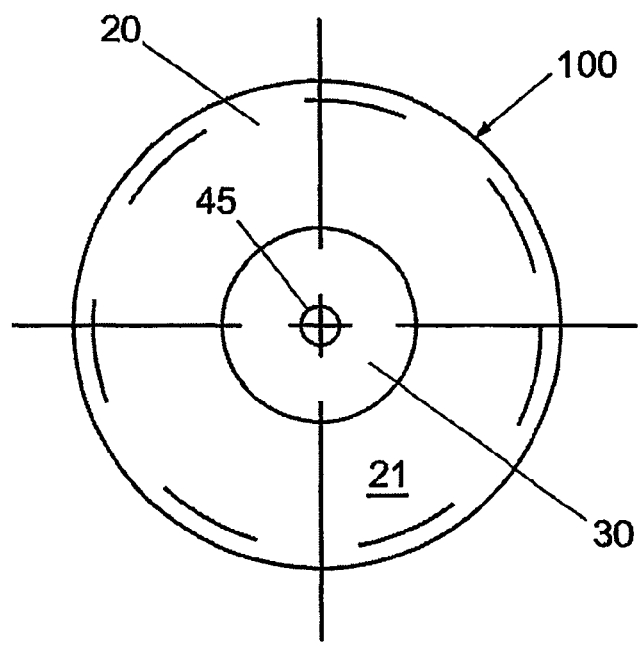
FIG. 3 is a front view of a probe cartridge assembly according to the present invention.
Figure 4:
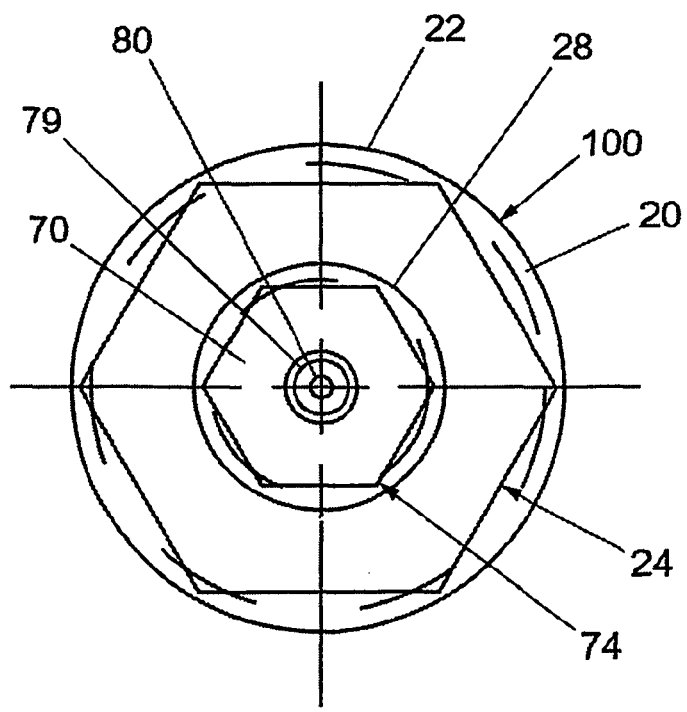
FIG. 4 is a rear view of a probe cartridge assembly according to the present invention.
Figure 5:
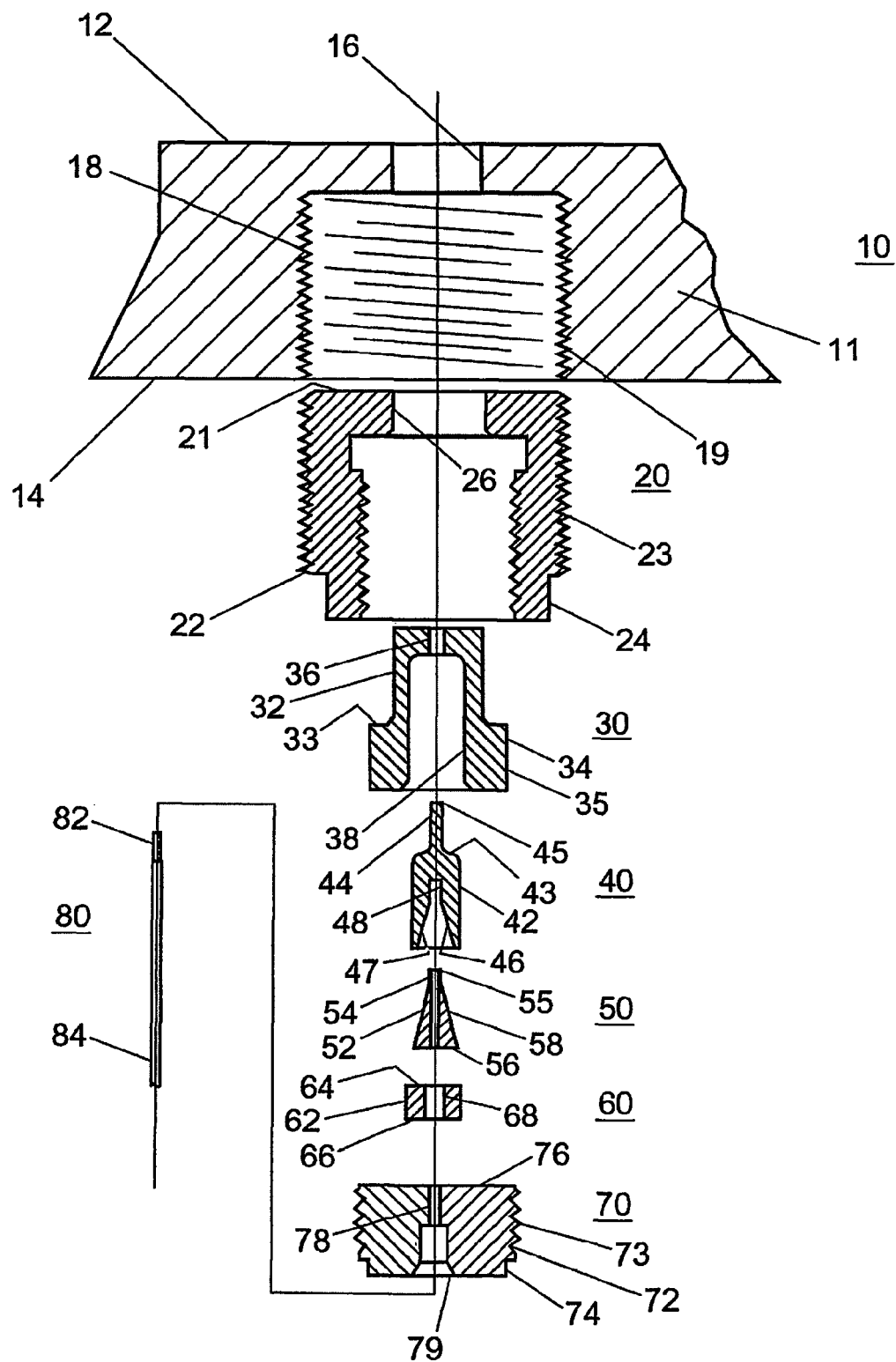
FIG. 5 is an exploded, cross-sectional, partial side view of the multi-probe assembly of FIG. 2 including the probe cartridge assembly.

Langmuir type probes are used to measure ion current density in various plasma sources and chambers. It has been the inventors experience that it is difficult to insert more than one probe at a time into the plasma generated. Therefore, the inventors have constructed a multi-probe assembly of, for example, seventeen probes that measure ion current density at different locations in one plasma. The present invention will now be described with reference to a preferred embodiment that provides an advantageous structure that overcomes the problems identified by the inventors which are described above.

Referring now to the drawings, FIGS. 1–5 depict an embodiment of a multi-probe assembly 10 including a probe cartridge assembly 100 according to the present invention. The multi-probe assembly 10 generally includes a mounting plate 11 having a plurality of mounting holes 18 and a plurality of probe cartridge assemblies 100 each mounted in a corresponding one of the plurality of mounting holes 18. The probe cartridge assemblies of the present invention generally include a mounting member 20, a probe insulator 30, a probe 40, a ferrule 50, a lead insulator 60, a retaining member 70, and a wire 80 having an electrical lead 82.

The multi-probe assembly 10 includes a mounting plate 11 having a first side 12 and a second side 14. The first side 12 of the mounting plate 11 is oriented toward the environment being analyzed. The first side 12 of the mounting plate 11 has a plurality of apertures or openings 16, which are preferably cylindrical in shape and which extend through the mounting plate 11 and connect to the mounting holes 18. The mounting holes 18 are preferably cylindrical in shape, and are flush with the second side 14 of the mounting plate 11 and extend within the mounting plate 11. The mounting holes 18 are provided with internal threads 19, while the apertures 16 preferably have smooth internal surfaces. The mounting holes 18 depicted in FIG. 1 are arranged in an orthogonal manner such that the mounting holes 18 are located in positions extending outward from a central mounting hole along an x-axis and a y-axis. Alternatively, the number and orientation of mounting holes can be varied depending upon the desired accuracy of the measurements by the probes.

The mounting member 20, such as a mounting nut or other structure, has an external, preferably cylindrical, surface 22 having external threads 23. The external surface 22 and external threads 23 are configured to fit within the mounting hole 18 and engage with the internal threads 19 therein. The mounting member 20 also includes an internal cavity 28, which is preferably cylindrical in shape, and an aperture or opening 26 extending from a front surface 21 of the mounting member 20 through the mounting member 20 and connects with the internal cavity 28. The internal cavity 28 of the mounting member 20 preferably has internal threads 29. The mounting member 20 preferably includes a tool engagement portion 24, such as a hexagonal head portion or other configuration that allows a tool to engage the mounting member 20. The mounting member 20 can be inserted within at least one mounting hole 18 of the plurality of mounting holes such that the internal threads 19 of the mounting hole 18 mate with the external threads 23 of the mounting member 20. The tool engagement portion 24 can be utilized to insert and remove the mounting member 20 from the mounting hole 18.

The probe insulator 30 includes a second portion 32 that is preferably cylindrical in shape and is configured to extend through opening 26 in the mounting member 20 and opening 16 in the mounting plate 11, when the mounting plate 11, the mounting member 20, and the probe insulator 30 are assembled. The probe insulator 30 includes a first portion 34 that is preferably cylindrical in shape and of a larger diameter than the second portion 32, such that a lip portion 33 is formed between the first portion 34 and the second portion 32 which abuts the end of the internal cavity 28. The first portion 34 preferably includes a flat surface 35 that are configured to slide within the internal threads 29 in the internal cavity 28 of the mounting member 20. Alternatively, the probe insulator can be formed without external threads on the first portion 34. The probe insulator 30 has an internal cavity 38 that is preferably cylindrical in shape, and an opening 36 extending through the probe insulator 30 from a front end of the probe insulator 30 to the internal cavity 38. The probe insulator 30 is made of an electrically insulating or non-conductive material, such as ceramic, quartz, alumina, or some other electrically insulating or non-conductive material.

The probe 40 includes a first portion 42 that is preferably cylindrical in shape, and is configured to fit within the internal cavity of the probe insulator 30. The probe further includes a second portion 44 that is also preferably cylindrical in shape and is configured to extend through opening 36 in the probe insulator 30, when the probe 40 and the probe insulator 30 are assembled. The first portion 42 is preferably of a larger diameter than the second portion 44, such that a lip portion 43 is formed between the first portion 42 and the second portion 44 which abuts the end of the internal cavity 38. The second portion 44 has a probe tip 45 on a terminal end thereof. The probe 40 includes an internal cavity 46, which includes a first portion with an inclined surface 47 and a second portion with a preferably cylindrical cavity 48. The inclined surface 47 is preferably has a conical shape, although other alternative shapes can be used such as wedge-type shapes or pyramid-type shapes. The probe 40 is positioned such that the first portion 42 is within the internal cavity 38 of the probe insulator 30 and the tip 45 extends through the opening 36 of the probe insulator 30. The probe 40 is made of an electrically conductive material, such as nickel-plated tungsten alloy or other conductive material.

The ferrule 50 has an outer inclined surface 52 that is configured to abut the inclined surface 47 of the internal cavity 46 of the probe 40. The ferrule 50 is positioned such that the ferrule 50 is within the internal cavity 38 of the probe insulator 30, and such that the outer inclined surface 52 of the ferrule 50 contacts the inclined surface 47 of the internal cavity 46 of the probe 40. The outer inclined surface 52 of the ferrule 50 is preferably conical, and the inclined surface 47 of the internal cavity 46 of the probe 40 is preferably conical. However, as noted above, if the inclined surface 47 of the probe 40 is formed in a different shape, for example a wedge-type shape or a pyramid-type shape, then the outer inclined surface 52 of the ferrule is preferably formed in a corresponding shape. The ferrule 50 is preferably made of a deformable and conductive material, such as silver-plated copper, silver-plated aluminum, or some other deformable and conductive material. The ferrule 50 further includes an internal cavity 58. The internal cavity 58 of the ferrule 50 preferably extends a length of the ferrule 50 from an opening 55 at a front end 54 of the ferrule 50 to a rear end 56 of the ferrule 50. When the probe assembly 10 is assembled, the electrical lead 82 preferably extends through the ferrule 50 via the internal cavity 58.

The lead insulator 60 has an outer surface 62 that is preferably cylindrically shaped and is preferably configured to fit within the internal cavity 38 of the probe insulator 30. The lead insulator 60 has a through-hole that extends from a front surface 64 thereof to a rear surface 66 thereof. When the probe assembly 100 is assembled, the lead insulator 60 is positioned such that a portion of the lead insulator is within the internal cavity 38 of the probe insulator 30 and abuts the rear surface 56 of the ferrule 50. The lead insulator 60 is made of an electrically insulating or non-conductive material, such as ceramic, quartz, alumina, or some other electrically insulating or non-conductive material.

The retaining member 70 has an exterior surface 72 that is configured to fit within the internal cavity 28 of the mounting member 20, and is preferably cylindrically shaped. The exterior surface 72 includes exterior threads 73 on a front portion thereof, which are configured to mate with the internal threads 29 on the internal cavity 28 of the mounting member 20. The exterior surface 72 further includes a tool engagement portion 74, such as a hex-head portion or other configuration that allows a tool to engage the retaining member 70. The retaining member 70 has a through-hole 78 that extends from a front surface 76 of the retaining member 70 to a cavity 79 at a rear of the retaining member 70. When the probe assembly 100 is assembled, the retaining member 70 is positioned such that the surface 76 of the retaining member 70 abuts the surface 66 of the lead insulator 60, and such that a portion of the retaining member 70 is within the internal cavity 28 of the mounting member 20 and the retaining member 70 is adjustably mated with the mounting member 20. As stated above, the retaining member 70 preferably has external threads 73 that are mated with the internal threads 29 of the mounting member 20, thereby adjustably mating the retaining member 70 with the mounting member 20. The retaining member 70 and the mounting member 20 are removably mated with each other in order to provide easy maintenance to the internal features of the probe cartridge assembly 100.

The wire 80 includes an electrical lead 82 and preferably includes an outer coating of non-conductive material. The wire 80 extends through the through-hole 78 of the retaining member 70 and extends through the through-hole 68 of the lead insulator 60. The electrical lead 82 of the wire 80 extends within the internal cavity 58 of the ferrule 50 wherein the electrical lead 82 is electrically connected to the ferrule 50.

The retaining member 70 and the mounting member 20 are adjustably mated to each other in order to provide a clamping force to ensure proper electrical interconnection between the electric lead 82, the ferrule 50, and the probe 40. When the retaining member 70 is tightened onto the mounting member 20 using the tool engagement portion 74, the retaining member 70 and the mounting member inwardly compress the probe 40 and the ferrule 50 between the probe insulator 30 and the lead insulator 60 within the internal cavity 38. The compressive forces acting on the probe 40 and the ferrule 50 cause the inclined surface 47 of the probe 40 to compress the outer inclined surface 52 of the deformable ferrule 50, thereby causing the ferrule 50 to squeeze down on the electrical lead 82 of the wire 80 and ensure a good electrical interconnection between the probe 40, the ferrule 50, and the electrical lead 82. When the retaining member 70 is torqued to a predetermined value, the ferrule 50 is deformed to captivate the electrical lead 82, thereby providing excellent contact with the probe 40 and consequently the probe tip 45.

The probe insulator 30 and the lead insulator 60 provide an electrically insulative barrier around the probe 40 and the ferrule 50. The probe insulator 30 insulates the probe 40 and the ferrule 50 from contact with the mounting member 20 and the mounting plate 11, which may be formed of conductive or semi-conductive materials (or non-conductive materials if so desired). Additionally, the lead insulator 60 prevents the retaining member 70 from contacting the ferrule 50, thereby providing an additional insulative barrier between the ferrule 50 and the retaining member 70, which may be formed of conductive or semi-conductive material (or non-conductive materials if so desired).

While the preferred embodiment described herein describes the use of mating threads to adjustably mate the retaining member to the mounting member, other mechanical interconnections can be utilized. Additionally, the shapes of the various features are not limited to those described and depicted in the preferred embodiment and can be modified as will be readily apparent to one of skill in the art.

The above discussion of the multi-probe assembly 10 and probe cartridge assemblies 100, generally depicted in FIGS. 2–5, provides a description of a general, non-limiting, preferred embodiment according to the present invention. The following discussion provides a description of a specific, non-limiting, preferred embodiment and a method of use of the embodiment.

The multi-probe assembly 10 depicted in FIG. 1 includes seventeen selectable probe cartridge assemblies each having a probe tip 45 extending vertically from the surface of the mounting plate or chuck 11 on a vacuum stand. In this embodiment the assembly is permanently mounted in the vacuum station, and is not transportable to other systems. In this embodiment the chuck 11 is not driven with RF, and is simply a grounded, cooled aluminum plate. The probes tips 45 are arranged on orthogonal axes with a 1-inch center-to-center spacing. There are eight probes along the x-axis, eight along the y-axis, and one in the center, for a total of seventeen probes.

Each individual probe tip 45 is formed of tungsten wire and is provided within a quartz tube or probe insulator 30. The upper end of the (0.25-inch diameter) quartz tube 30 is in the plane of the upper chuck surface, exposed to the plasma. The tungsten probe tip 45 is 0.030 inches (or 0.0762 cm) in diameter, and extends approximately 0.079 inches (or 0.2 cm) beyond the end of the quartz tube, providing 0.05 cm$^2$ of surface area exposed to the plasma.

Electrical connection to each probe is made using silver-plated copper wire insulated with Type F (260C) Kapton®. The probe cartridge assemblies 100 are attached to the chuck 11 with individual hardware as described above with respect to FIGS. 2–5, advantageously allowing for the replacement of individual probe cartridge assemblies without the need to remove all of them. The probe cartridge assemblies are connected to a multiconductor vacuum feedthrough with Kapton coated wires inside the vacuum chamber. Outside the chamber a multiconductor cable connects the vacuum feedthrough to a cabinet housing voltage controlled relays and mechanical switches. The probe may be selected manually with the mechanical switches, or automatically using a control system, such as a computer running a Visual Basic program in Microsoft Windows 95. Voltage is applied to only one probe at a time, and is usually swept from +10 to −100V in less than one second with a Kepco BOP 100-1M Bipolar Operational Power Supply/Amplifier. The program allows the operator to select which probes to use for a measurement, and in which order voltage will be applied to them. The current associated with each value of applied probe voltage is calculated from the voltage drop across a sampling resistor. The current voltage data pairs are stored in the computer. After a fall set of probe data has been recorded the data is imported into a spreadsheet, such an Excel spreadsheet, for analysis.

The source to be tested should be fully operational. The Langmuir probe measurements are performed with the plasma source in operation. This requires the use of a RF power supply, and, for most sources, the use of a dielectric coolant such as Fluorinert.

The parameters usually of most interest are the plasma density and electron temperature, and their variation across the wafer. An immediate insight into the degree of density uniformity may be gained by simply plotting the ion current density as a function of position across the chuck. The values of current at −30V and −60V may be used. Simply divide the current value by the probe surface area (0.05 cm$^2$), and plot the resultant current density values as a function of position for the two orthogonal directions.

The following example assumes a Maxwellian electron energy distribution, and a collisionless thin sheath, i.e., any ions that hit the sheath boundary will be collected on the probe. The first step toward deriving the actual values of plasma density and electron temperature is to determine the plasma potential, Vp. The plasma potential occurs at the maximum of the first derivative of the electron current to the probe. A simple technique to approximate Vp is to plot the natural log of current versus probe voltage and make straight line fits to the data above and below the knee. A more accurate technique, is to use the voltage at which dI/dV reaches a maximum. Assuming a Maxwellian electron energy distribution the electron temperature may now be derived from a plot of ln(I) versus ($V_{plasma}-V_{probe}$). The electron temperature (eV) is the inverse slope of the ln(I) versus ($V_{plama}-V_{probe}$) curve.

Finally, with a value for $T_e$, and assuming the experiment is in the collisionless, thin sheath regime, the density of the plasma far from the probe can be found from the following equation;

$$n\,(\text{m}^3) = 1.05 \times 10^{15} \sqrt{\frac{M_{amu} I(\text{amps})}{T_{eV} A_{probe}(\text{m}^2)}}$$

where $\mu_{amu}$ is the ion mass in amu, (for Argon $\mu$=40), $T_{ev}$ is the electron temperature in eV, I is the probe current in amps, and $A_{probe}$ is the probe surface area in m$^2$.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

What is claimed is:

1. A probe cartridge assembly comprising:
   a mounting member having an internal cavity and an opening extending through said mounting member;
   a probe insulator having an internal cavity and an opening extending through said probe insulator, said probe insulator being positioned such that a first portion of said probe insulator is within said internal cavity of said mounting member and a second portion of said probe insulator extends through said opening of said mounting member;

a probe having a tip and an internal cavity, said internal cavity having an inclined surface, said probe being positioned such that a first portion of said probe is within said internal cavity of said probe insulator and said tip extends through said opening of said probe insulator;

a ferrule having an outer inclined surface and an internal cavity, said ferrule being positioned such that said ferrule is within said internal cavity of said probe insulator, and such that said outer inclined surface of said ferrule contacts said inclined surface of said internal cavity of said probe;

a lead insulator having a through-hole, said lead insulator being positioned such that a portion of said lead insulator is within said internal cavity of said probe insulator and abuts said ferrule;

a retaining member having a through-hole, said retaining member being positioned such that said retaining member abuts said lead insulator and such that a portion of said retaining member is within said internal cavity of said mounting member and said retaining member is adjustably mated with said mounting member; and a wire with an electrical lead, said wire extending through said through-hole of said retaining member and extending through said through-hole of said lead insulator, said electrical lead of said wire extending within said internal cavity of said ferrule wherein said electrical lead is electrically connected to said ferrule.

2. The probe cartridge assembly according to claim 1, wherein said internal cavity of said mounting member having internal threads, said retaining member having external threads, said external threads of said retaining member are mated with said internal threads of said mounting member, thereby adjustably mating said retaining member with said mounting member.

3. The probe cartridge assembly according to claim 2, wherein said retaining member includes a tool engagement portion.

4. The probe cartridge assembly according to claim 1, wherein said mounting member includes a tool engagement portion.

5. The probe cartridge assembly according to claim 1, wherein said first portion of said probe insulator has external threads that are mated with said internal threads of said mounting member.

6. The probe cartridge assembly according to claim 1, wherein said outer inclined surface of said ferrule is conical, and wherein said inclined surface of said internal cavity of said probe is conical.

7. The probe cartridge assembly according to claim 1, wherein said ferrule is made of a deformable material.

8. The probe cartridge assembly according to claim 1, wherein said internal cavity of said ferrule extends a length of said ferrule, and wherein said electrical lead extends through said ferrule via said internal cavity.

9. The probe cartridge assembly according to claim 1, wherein said mounting member has external threads.

10. A multi-probe assembly comprising a mounting plate having a plurality of mounting holes and a plurality of probe cartridge assemblies mounted in a corresponding one of said plurality of mounting holes, wherein at least one probe cartridge assembly of said probe cartridge assemblies comprises:

a mounting member having an internal cavity and an opening extending through said mounting member;

a probe insulator having an internal cavity and an opening extending through said probe insulator, said probe insulator being positioned such that a first portion of said probe insulator is within said internal cavity of said mounting member and a second portion of said probe insulator extends through said opening of said mounting member;

a probe having a tip and an internal cavity, said internal cavity having an inclined surface, said probe being positioned such that a first portion of said probe is within said internal cavity of said probe insulator and said tip extends through said opening of said probe insulator;

a ferrule having an outer inclined surface and an internal cavity, said ferrule being positioned such that said ferrule is within said internal cavity of said probe insulator, and such that said outer inclined surface of said ferrule contacts said inclined surface of said internal cavity of said probe;

a lead insulator having a through-hole, said lead insulator being positioned such that a portion of said lead insulator is within said internal cavity of said probe insulator and abuts said ferrule;

a retaining member having a through-hole, said retaining member being positioned such that said retaining member abuts said lead insulator and such that a portion of said retaining member is within said internal cavity of said mounting member and said retaining member is adjustably mated with said mounting member; and a wire with an electrical lead, said wire extending through said through-hole of said retaining member and extending through said through-hole of said lead insulator, said electrical lead of said wire extending within said internal cavity of said ferrule wherein said electrical lead is electrically connected to said ferrule.

11. The multi-probe assembly according to claim 10, wherein said internal cavity of said mounting member having internal threads, said retaining member having external threads, said external threads of said retaining member are mated with said internal threads of said mounting member, thereby adjustably mating said retaining member with said mounting member.

12. The multi-probe assembly according to claim 11, wherein said retaining member includes a tool engagement portion.

13. The multi-probe assembly according to claim 10, wherein said mounting member includes a tool engagement portion.

14. The multi-probe assembly according to claim 10, wherein said first portion of said probe insulator has external threads that are mated with said internal threads of said mounting member.

15. The multi-probe assembly according to claim 10, wherein said outer inclined surface of said ferrule is conical, and wherein said inclined surface of said internal cavity of said probe is conical.

16. The multi-probe assembly according to claim 10, wherein said ferrule is made of a deformable material.

17. The multi-probe assembly according to claim 10, wherein said internal cavity of said ferrule extends a length of said ferrule, and wherein said electrical lead extends through said ferrule via said internal cavity.

18. The multi-probe assembly according to claim 10, wherein said mounting member has external threads, and wherein at least one mounting hole of said plurality of mounting holes has internal threads mated with said external threads of said mounting member.

19. A probe cartridge assembly comprising:
- a mounting member having an internal cavity and an opening extending through said mounting member;
- a probe insulator having an internal cavity and an opening extending through said probe insulator, said probe insulator being seated within said internal cavity of said mounting member;
- a probe having a tip and an internal cavity, said internal cavity having an inclined surface, said probe being seated within said internal cavity of said probe insulator with said tip extending through said opening of said probe insulator and said opening of said mounting member;
- a ferrule having an outer inclined surface and an internal cavity, said ferrule being positioned within said internal cavity of said probe insulator such that said outer inclined surface of said ferrule contacts said inclined surface of said internal cavity of said probe;
- a lead insulator having a portion positioned within said internal cavity of said probe such that said ferrule is sandwiched between said probe and said lead insulator;
- a retaining member adjustably mated with said mounting member, said retaining member being positioned such that said retaining member abuts said lead insulator and retains said probe insulator, said probe, said ferrule, and said lead insulator within said internal cavity of said mounting member; and
- a wire with an electrical lead electrically connected to said ferrule.

* * * * *